United States Patent
Huang

(10) Patent No.: US 8,559,212 B2
(45) Date of Patent: Oct. 15, 2013

(54) MEMORY CIRCUIT AND WORD LINE CONTROL CIRCUIT

(75) Inventor: Shih-Huang Huang, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 101 days.

(21) Appl. No.: 13/176,852

(22) Filed: Jul. 6, 2011

(65) Prior Publication Data
US 2013/0010531 A1   Jan. 10, 2013

(51) Int. Cl.
*G11C 11/00* (2006.01)
(52) U.S. Cl.
USPC .......................................................... 365/154
(58) Field of Classification Search
USPC .......................................................... 365/154
See application file for complete search history.

(56) References Cited

U.S. PATENT DOCUMENTS

| | | | |
|---|---|---|---|
| 8,345,504 B2 * | 1/2013 | Chuang et al. | 365/226 |
| 2006/0226869 A1 * | 10/2006 | Chong | 326/33 |
| 2007/0274124 A1 * | 11/2007 | Otsuka | 365/154 |
| 2010/0097844 A1 * | 4/2010 | Liu | 365/156 |

* cited by examiner

*Primary Examiner* — Huan Hoang
*Assistant Examiner* — Min Huang
(74) *Attorney, Agent, or Firm* — McClure, Qualey & Rodack, LLP

(57) ABSTRACT

The invention provides a memory circuit. In one embodiment, the memory circuit comprises a first PMOS transistor, a second PMOS transistor, a first NMOS transistor, a second PMOS transistor, and a memory cell array. The first PMOS transistor is coupled between a first voltage terminal and a first node. The second PMOS transistor is coupled between the first voltage terminal and a second node. The first NMOS transistor is coupled between a third node and a second voltage terminal. The second NMOS transistor is coupled between a fourth node and the second voltage terminal. The memory cell array comprises a plurality of memory cells, at least one comprising a first inverter and a second inverter. A positive power terminal of the first inverter is coupled to the first node, a negative power terminal of the first inverter is coupled to the third node, a positive power terminal of the second inverter is coupled to the second node, and a negative power terminal of the second inverter is coupled to the fourth node.

15 Claims, 14 Drawing Sheets

| Voltage\Mode | VPS | VPDL | VPDR | VPSB | VNDLB | VNDRB |
|---|---|---|---|---|---|---|
| Active | Low | Low | Low | High | High | High |
| Sleep | High | Low | Low | Low | High | High |
| Power Down | Low | Low | High | High | Low | High |

FIG. 5B

| Voltage / Mode | VPS | VPDL | VPDR | VPSB | VNDLB | VNDRB |
|---|---|---|---|---|---|---|
| Active | High | Low | Low | Low | High | High |
| Sleep | Low | High | High | High | Low | Low |
| Power Down | High | Low | High | Low | Low | High |

FIG. 6B

MEMORY CIRCUIT AND WORD LINE CONTROL CIRCUIT

BACKGROUND OF THE INVENTION

1. Field of the Invention

The invention relates to a memory, and more particularly to a memory circuit.

2. Description of the Related Art

A memory circuit includes a plurality of memory cells for storing data. A memory circuit may operate in three different modes including an active mode, a sleep mode, and a power down mode. When the memory circuit operates in the active mode, data can be normally written to and read from the memory circuit, but the power consumption of the memory circuit is higher. When the memory circuit operates in the sleep mode, the power consumption of the memory circuit is reduced, the memory circuit can still keep data previously stored therein, but data can not be written to and read from the memory circuit. When the memory circuit operates in the power down mode, the power consumption of the memory circuit is further reduced, but the memory circuit cannot hold data previously stored therein.

Referring to FIG. 1A, a block diagram of a first conventional memory circuit 100 is shown. The conventional memory circuit 100 includes two PMOS transistors 101 and 102 and a memory array 110. The memory array 110 includes a plurality of memory cells for data storage. The area of the PMOS transistor 101 is larger than that of the PMOS transistor 102. The PMOS transistor 101 is coupled between a first voltage terminal $V_{DD}$ and a node 103, the PMOS transistor 102 is coupled between the voltage source $V_{DD}$ and the node 103, and the memory array 110 is coupled between the node 103 and a ground GND. When the memory circuit 100 operates in an active mode, an active signal turns on the PMOS transistor 101, and a sleep signal turns off the PMOS transistor 102. When the memory circuit 100 operates in a sleep mode, the sleep signal turns on the PMOS transistor 102, and the active signal turns off the PMOS transistor 101. When the memory circuit 100 operates in a power down mode, the active signal turns off the PMOS transistor 101, and the sleep signal turns off the PMOS transistor 102, cutting off the power supply to the memory circuit 100.

Because a power supply to a memory array of a conventional memory circuit is cut off in a power down mode, when an operating mode of the conventional memory circuit switches from the power down mode to an active mode, the voltages of all circuit components of the memory circuit must be charged to normal values of the active mode before the memory circuit can normally function in the active mode. Charging of the circuit component requires a large amount of power (referred to as a rushing power), and requires a long time period (referred to as wakeup time). When the operating mode of a memory circuit switches from a power down mode to an active mode, the large rushing power negatively impacts the performance of the memory circuit, and the long wakeup time also degrades the performance of the memory circuit.

To reduce the rushing power, a memory circuit 170 is shown in FIG. 1B. The memory circuit 170 includes a plurality of PMOS transistors 171, 172, ..., 17n, and a plurality of delay elements 181, 182, ..., 18(n−1). The PMOS transistors 171, 172, ..., 17n are coupled between a first voltage terminal VDD and a node VVDD providing power to a memory array. When a sleep signal switches from a logic high voltage to a logic low voltage, the operating mode of the memory circuit switches from a sleep mode to an active mode, and the sleep signal is then fed to the gate of the first PMOS transistor 171 to turn on the first PMOS transistor 171. A delayed sleep signal is then fed to the gate of the second PMOS transistor 172 to turn on the second PMOS transistor 172. The PMOS transistors 171, 172, ..., 17n are sequentially turned on to reduce a rushing power level. The wakeup time period of the memory circuit 170, however, is extended, degrading performance of the memory circuit 170. Thus, a memory circuit capable of switching an operating mode from a power down mode to an active mode with a lower rushing power and a shorter wakeup time period is required.

BRIEF SUMMARY OF THE INVENTION

The invention provides a memory circuit. In one embodiment, the memory circuit comprises a first PMOS transistor, a second PMOS transistor, a first NMOS transistor, a second PMOS transistor, and a memory cell array. The first PMOS transistor is coupled between a first voltage terminal and a first node. The second PMOS transistor is coupled between the first voltage terminal and a second node. The first NMOS transistor is coupled between a third node and a second voltage terminal. The second NMOS transistor is coupled between a fourth node and the second voltage terminal. The memory cell array comprises a plurality of memory cells, wherein at least one of the memory cells comprises a first inverter and a second inverter, a positive power terminal of the first inverter is coupled to the first node, a negative power terminal of the first inverter is coupled to the third node, a positive power terminal of the second inverter is coupled to the second node, and a negative power terminal of the second inverter is coupled to the fourth node.

The invention also provides a memory circuit. In one embodiment, the memory circuit comprises a first PMOS transistor, a second PMOS transistor, a third PMOS transistor, a fourth PMOS transistor, a first NMOS transistor, a second NMOS transistor, a third NMOS transistor, a fourth NMOS transistor, and a memory cell array. The first PMOS transistor is coupled between a fifth node and a first node. The second PMOS transistor is coupled between the fifth node and a second node. The third PMOS transistor is coupled between a first voltage terminal and the fifth node, and has a gate coupled to the fifth node. The fourth PMOS transistor is coupled between the first voltage terminal and the fifth node. The first NMOS transistor is coupled between a third node and a sixth node. The second NMOS transistor is coupled between a fourth node and the sixth node. The third NMOS transistor is coupled between the sixth node and a second voltage terminal and has a gate coupled to the sixth node. The fourth NMOS transistor is coupled between the sixth node and the second voltage terminal. The memory cell array comprises a plurality of memory cells, wherein at least one of the memory cells comprises a first inverter and a second inverter, a positive power terminal of the first inverter is coupled to the first node, a negative power terminal of the first inverter is coupled to the third node, a positive power terminal of the second inverter is coupled to the second node, and a negative power terminal of the second inverter is coupled to the fourth node.

The invention also provides a memory circuit. In one embodiment, the memory circuit comprises a first PMOS transistor, a second PMOS transistor, a third PMOS transistor, a fourth PMOS transistor, a fifth PMOS transistor, a first NMOS transistor, a second NMOS transistor, a third NMOS transistor, a fourth NMOS transistor, a fifth NMOS transistor, and a memory cell array. The first PMOS transistor is coupled between a first voltage terminal and a first node. The second PMOS transistor is coupled between the first voltage terminal and a second node. The third PMOS transistor is coupled between the first voltage terminal and a fifth node. The fourth PMOS transistor is coupled between the first node and the fifth node and has a gate coupled to the first node. The fifth PMOS transistor is coupled between the second node and the fifth node and has a gate coupled to the second node. The first NMOS transistor is coupled between a third node and a second voltage terminal. The second NMOS transistor is coupled between a fourth node and the second voltage terminal. The third NMOS transistor is coupled between a sixth node and the second voltage terminal. The fourth NMOS transistor is coupled between the sixth node and the third node, having a gate coupled to the third node. The fifth NMOS transistor is coupled between the sixth node and the fourth node and has a gate coupled to the fourth node. The memory cell array comprises a plurality of memory cells, wherein at least one of the memory cells comprises a first inverter and a second inverter, a positive power terminal of the first inverter is coupled to the first node, a negative power terminal of the first inverter is coupled to the third node, a positive power terminal of the second inverter is coupled to the second node, and a negative power terminal of the second inverter is coupled to the fourth node.

The invention provides a word line control circuit. In one embodiment, the word line control circuit comprises a first PMOS transistor, a first NMOS transistor, and a plurality of word line drivers. The first PMOS transistor is coupled between a first voltage terminal and a first node and has a gate coupled to a first selection signal. The first NMOS transistor is coupled between a second node and a second voltage terminal, and has a gate coupled to an inverted first selection signal, wherein the inverted first selection signal is obtained by inverting the first selection signal. At least one of the plurality of word line drivers comprises a first inverter and a second inverter. A positive power terminal of the first inverter is coupled to the first voltage terminal, a negative power terminal of the first inverter is coupled to the second node, a positive power terminal of the second inverter is coupled to the first node, and a negative power terminal of the second inverter is coupled to the second voltage terminal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 5B shows gate voltages of PMOS transistors and NMOS transistors of the memory circuit shown in FIG. 5A in different operating modes;

FIG. 6B shows gate voltages of PMOS transistors and NMOS transistors of the memory circuit shown in FIG. 6A in different operating modes;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
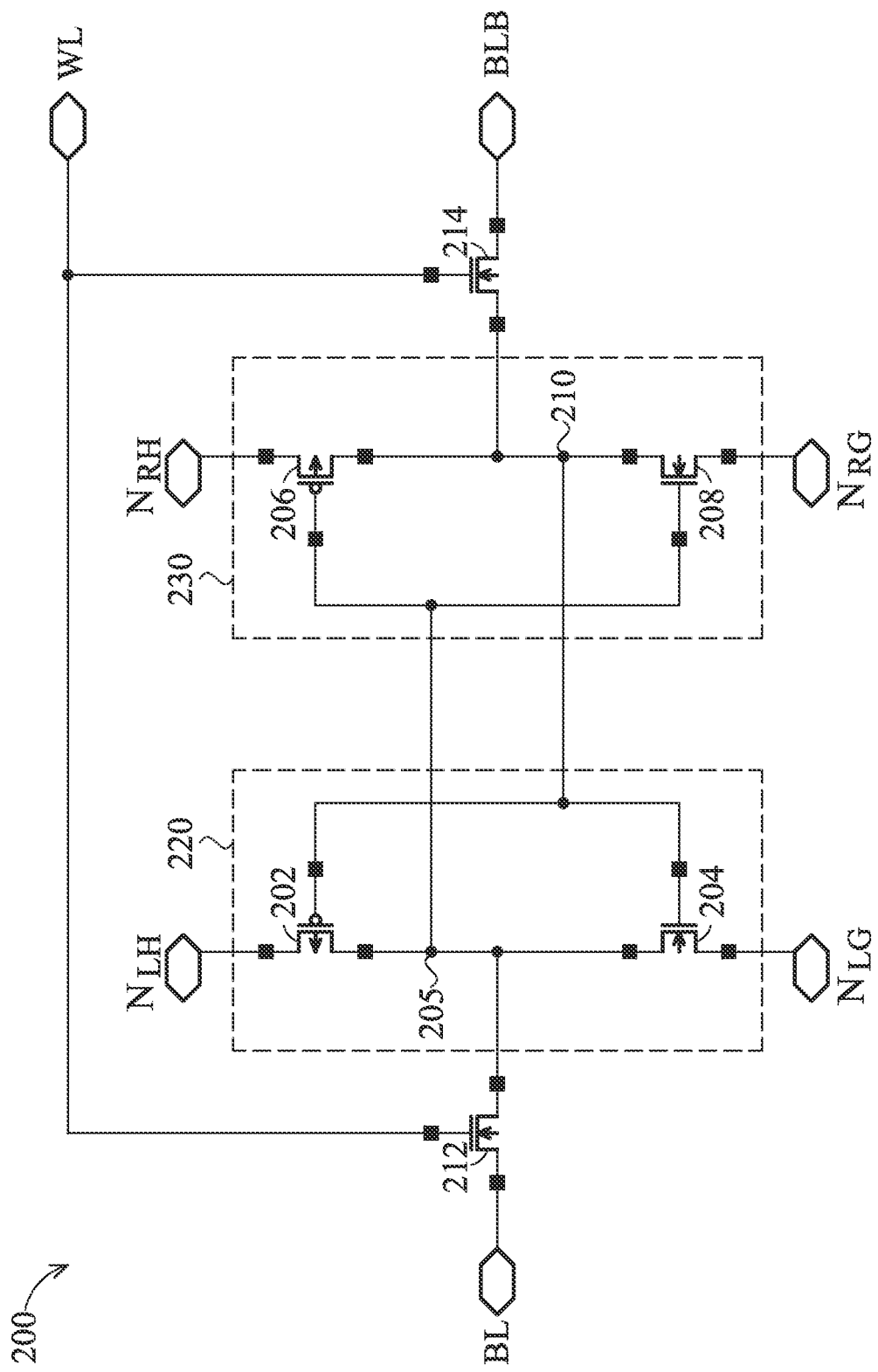
FIG. 2 is a block diagram of a memory cell of a memory cell array according to the invention.

Referring to FIG. 2, a block diagram of a memory cell 200 of a memory cell array according to the invention is shown. The memory cell 200 in this embodiment is illustrative only; the memory circuit of the present invention may include any other types of memory cells. The memory cell 200 includes a first inverter 220, a second inverter 230, and two transmission gate transistors 212 and 214. In this embodiment, the input terminal of the first inverter 220 is coupled to the output terminal 210 of the second inverter 230, and the input terminal of the second inverter 220 is coupled to the output terminal 205 of the first inverter 220. In other words, the first inverter 220 and the second inverter 230 are cross-coupled. A first transmission gate transistor 212 is coupled between a bit line BL and the output terminal 205 of the first inverter 220. A second transmission gate transistor 214 is coupled between a bit bar line BLB and the output terminal 210 of the second inverter 220. A word line WL coupled to the gates of the transmission gate transistors 212 and 214 determines whether the transmission gate transistors 212 and 214 are turned on.

In one embodiment, the first inverter 220 includes a PMOS transistor 202 and an NMOS transistor 204. The PMOS transistor 202 has a gate coupled to the terminal 210 and a drain coupled to the node 205. The NMOS transistor 204 has a gate coupled to the node 210 and a drain coupled to the terminal 205. The source of the PMOS transistor 202 is a positive power terminal of the first inverter 220 and is coupled to a first node $N_{LH}$. The source of the NMOS transistor 204 is a negative power terminal of the first inverter 220 and is coupled to a third node $N_{LG}$. In one embodiment, the second inverter 230 includes a PMOS transistor 206 and an NMOS transistor 208. The PMOS transistor 206 has a gate coupled to the node 205 and a drain coupled to the node 210. The NMOS transistor 208 has a gate coupled to the node 205 and a drain coupled to the node 210. The source of the PMOS transistor 206 is a positive power terminal of the second inverter 230 and is coupled to a second node $N_{RH}$. The source of the NMOS transistor 208 is a negative power terminal of the second inverter 230 and is coupled to a fourth node $N_{RG}$.

Figure 3:
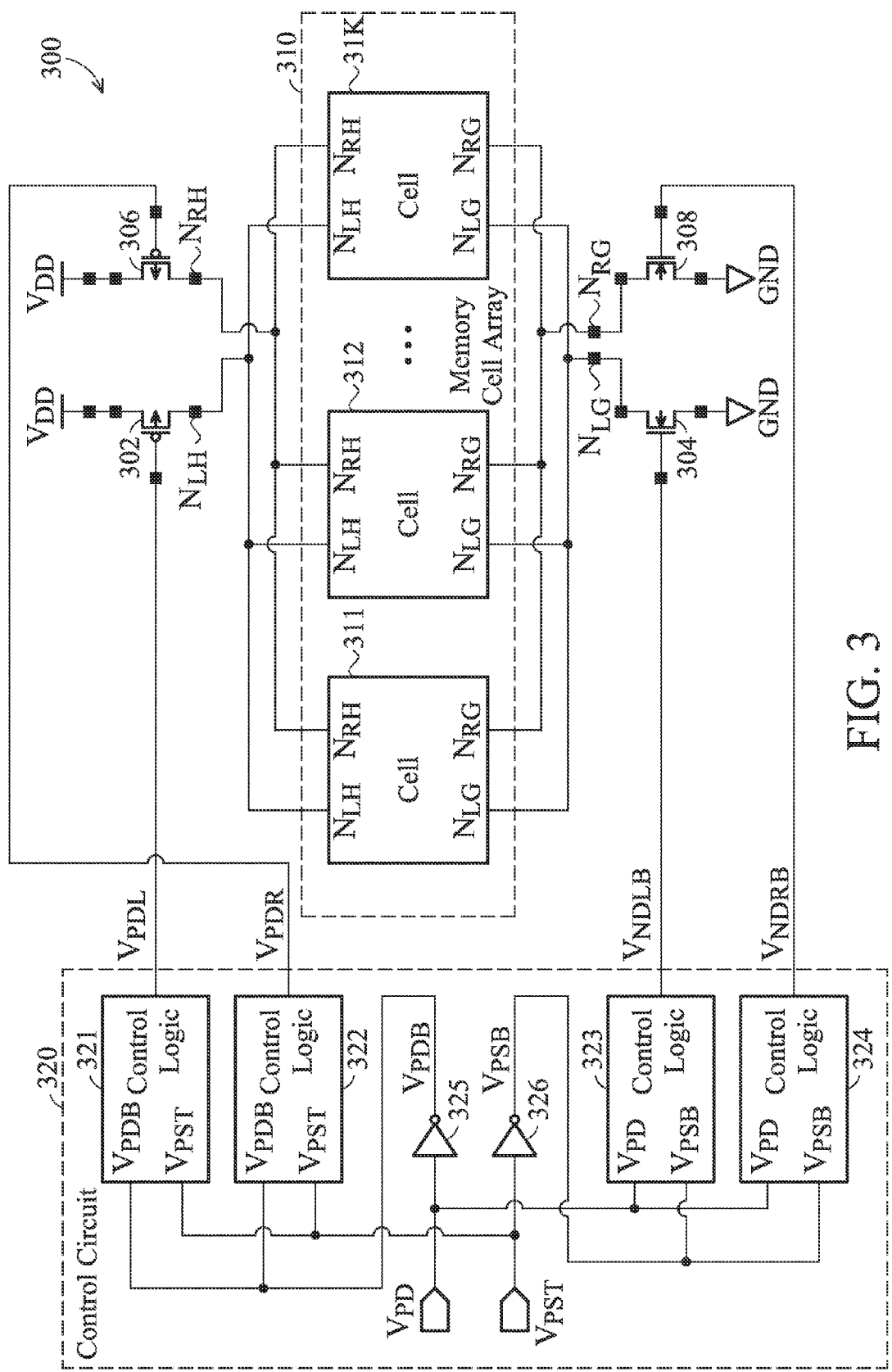
FIG. 3 is a block diagram of at least a portion of a first embodiment of a memory circuit according to the invention.

Referring to FIG. 3, a block diagram of at least a portion of a first embodiment of a memory circuit 300 according to the invention is shown. In one embodiment, the memory circuit 300 may include a memory cell array 310, two PMOS transistors 302 and 306, two NMOS transistors 304 and 308, and a control circuit 320. The memory circuit 310 may include a plurality of memory cells 311~31K. At least one of the memory cells 311~31K includes two inverters 220 and 230, as the memory cell 200 shown in FIG. 2. The positive power terminal of the first inverter 220 of at least one of the memory cells 311~31K is coupled to a first node $N_{LH}$. The negative power terminal of the first inverter 220 of at least one of the memory cells 311~31K is all coupled to a third node $N_{LG}$. The positive power terminal of the second inverter 230 of at least one of the memory cells 311~31K is coupled to a third node $N_{RH}$. The negative power terminal of the second inverter 230 of at least one of the memory cells 311~31K is coupled to a fourth node $N_{RG}$. In one embodiment, each of the memory cells 311~31K includes two inverters 220 and 230, and the positive power terminals of the first inverters 220 of the memory cells 311~31K are all coupled to a first node $N_{LH}$, the negative power terminals of the first inverters 220 of the memory cells 311~31K are all coupled to a third node $N_{LG}$, the positive power terminals of the second inverters 230 of the memory cells 311~31K are all coupled to a third node $N_{RH}$ and the negative power terminals of the second inverters 230 of the memory cells 311~31K are all coupled to a fourth node $N_{RG}$.

The PMOS transistor 302 has a source coupled to a first voltage terminal, such as $V_{DD}$ and a drain coupled to the first node $N_{LH}$. The PMOS transistor 306 has a source coupled to the first voltage terminal $V_{DD}$ and a drain coupled to the second node $N_{RH}$. The NMOS transistor 304 has a source coupled to a second voltage terminal, such as ground (GND) and a drain coupled to the third node $N_{LG}$. The NMOS transistor 308 has a source coupled to the second voltage terminal GND and a drain coupled to the fourth node $N_{RG}$. The control circuit 320 is capable of controlling the gate voltages $V_{PDL}$ and $V_{PDR}$ of the PMOS transistors 302 and 306 and the gate voltages $V_{NDLB}$ and $V_{NDRB}$ of the NMOS transistors 304 and 308. In this embodiment, the memory circuit 300 can operate in three different operating modes including an active mode, a sleep mode, and a power down mode. The control circuit 320 is capable of generating the gate voltages $V_{PDL}$, $V_{PDR}$, $V_{NDLB}$, and $V_{NDRB}$ according to the operating mode of the memory circuit 300, to control the transistors 302, 304, 306, and 308.

Figure 4A:
FIG. 4A shows a plurality of gate voltages generated by a control circuit according to different operating modes of the memory circuit shown in FIG. 3.

When the memory circuit 300 is operated in a power down mode, the memory cells 311~31K of the memory cell array 310 may not keep data previously stored therein, but the power consumption of the memory cell array 310 can be reduced to a lower or lowest level. Referring to FIG. 4A, a plurality of gate voltages $V_{PDL}$, $V_{PDR}$, $V_{NDLB}$, and $V_{NDRB}$ generated by the control circuit 320 according to different operating modes of the memory circuit 300 is shown. In another embodiment, the levels of the voltages $V_{PDL}$, $V_{PDR}$, $V_{NDLB}$, and $V_{NDRB}$ corresponding to a power down mode shown in FIG. 4A can be inverted. For example, in another embodiment, the levels of the voltages $V_{PDL}$, $V_{PDR}$, $V_{NDLB}$, and $V_{NDRB}$ corresponding to the power down mode can be respectively high, low, high, and low. When the memory circuit 300 is operated in a power down mode, the control circuit 320 is capable of generating a logic low voltage $V_{PDL}$ on the gate of the PMOS transistor 302, to turn on the PMOS transistor 302. The control circuit 320 is also capable of generating a logic high voltage $V_{PDR}$ on the gate of the PMOS transistor 306, to turn off the PMOS transistor 306. In addition, the control circuit 320 is capable of generating a logic low voltage $V_{NDLB}$ on the gate of the NMOS transistor 304, to turn off the NMOS transistor 304. Furthermore, the control circuit 320 is capable of generating a logic high voltage $V_{NDRB}$ on the gate of the NMOS transistor 308, to turn on the NMOS transistor 308.

Because the PMOS transistor 302 is turned on, the voltage of the first node $N_{LH}$ can be pulled up toward the voltage of the first voltage terminal, such as $V_{DD}$. The voltage of the node 205, which is the output terminal of the first inverter 220 of the memory cell 200 shown in FIG. 2, is therefore pulled up to a logic high voltage. Because the NMOS transistor 308 is turned on, the voltage of the fourth node $N_{RG}$ is pulled down toward the voltage of the second voltage terminal, such as GND. The voltage of the node 210, which is the output terminal of the second inverter 230 of the memory cell 200 shown in FIG. 2, is therefore pulled down to a logic low voltage. In addition, because the NMOS transistor 204 is turned off due to the logic low voltage on the node 210, the voltage of the third node $N_{LG}$ coupled to the source of the NMOS 204 is therefore slightly higher than the logic low voltage of the node 210. Similarly, because the PMOS transistor 206 is turned off due to the logic high voltage on the node 205, the voltage of the second node $N_{RH}$ coupled to the source of the PMOS 204 is therefore slightly lower than the logic high voltage of the node 205.

When the memory circuit 300 is operated in an active mode, data can be normally read from or written to the memory cells 311~31K of the memory cell array 310, but the power consumption of the memory cell array 310 is increased to a higher or highest level. When the memory circuit 300 is operated in an active mode, the control circuit 320 is capable of generating logic low voltages $V_{PDL}$ and $V_{PDR}$ on the gates of the PMOS transistors 302 and 306, to turn on the PMOS transistors 302 and 306. The control circuit 320 is also capable of generating logic high voltages $V_{NDLB}$ and $V_{NDRB}$ on the gates of the NMOS transistors 304 and 308, to turn on the NMOS transistors 304 and 308. Because the PMOS transistors 302 and 306 are turned on, the voltages of the first node $N_{LH}$ and the second node $N_{RH}$ can be pulled up toward the voltage of the first voltage terminal, such as VDD. Because the NMOS transistors 304 and 308 are turned on, the voltages of the third node $N_{LG}$ and the fourth node $N_{RG}$ can be pulled down toward the voltage of the second voltage terminal, such as GND. The memory cells 311~31K are therefore supplied with full power for data access operations.

When the memory circuit 300 is operated in a sleep mode, the memory cells 311~31K of the memory cell array 310 can still keep the data previously stored therein, but the power consumption of the memory cell array 310 is reduced to a lower level in comparison with that of the active mode. When the memory circuit 300 is operated in the sleep mode, the control circuit 320 is capable of generating voltages $V_{PDL}$ and $V_{PDR}$ toward the level of the threshold voltages of the PMOS transistors 302 and 306, to turn on the PMOS transistors 302 and 306. The control circuit 320 is also capable of generating voltages $V_{NDLB}$ and $V_{NDRB}$ toward the level of the threshold voltages of the NMOS transistors 304 and 308, to turn on the NMOS transistors 304 and 308. The memory cells 311~31K are therefore supplied with a lower power in comparison with that of the active mode.

Figure 4C:
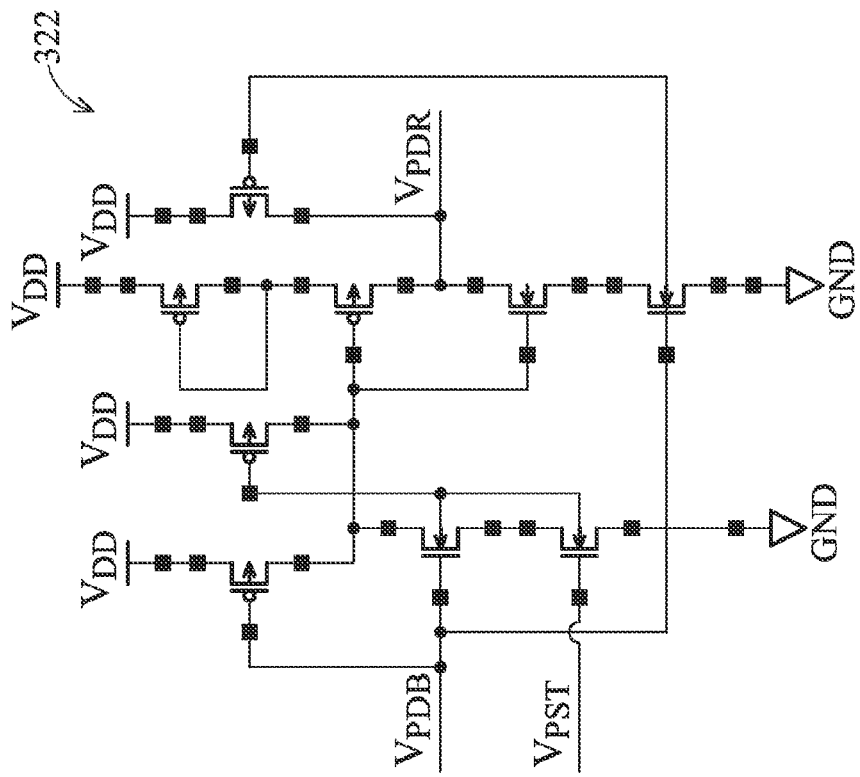
FIG. 4C shows an embodiment of a second control logic of the control circuit shown in FIG. 3.
Figure 4B:
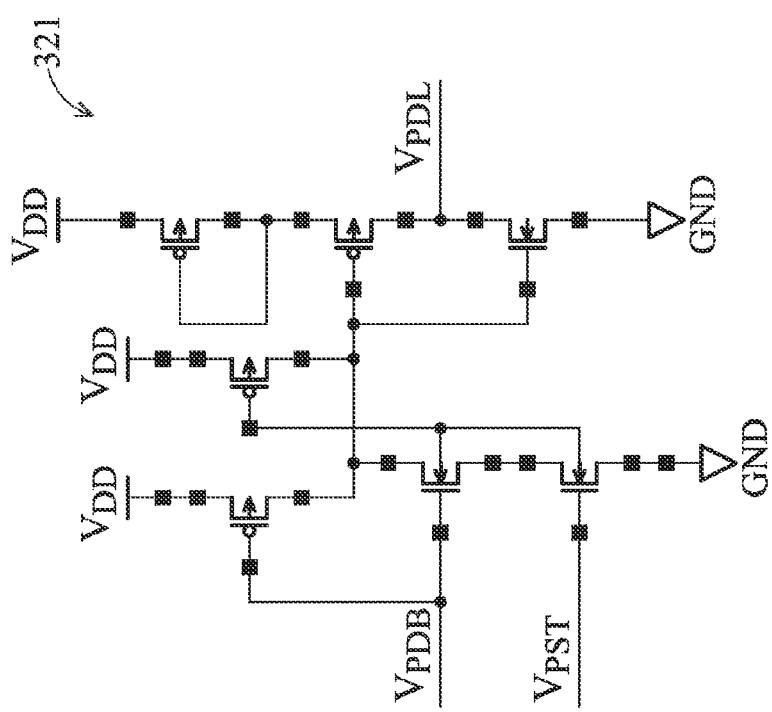
FIG. 4B shows an embodiment of a first control logic of the control circuit shown in FIG. 3.
Figure 4E:
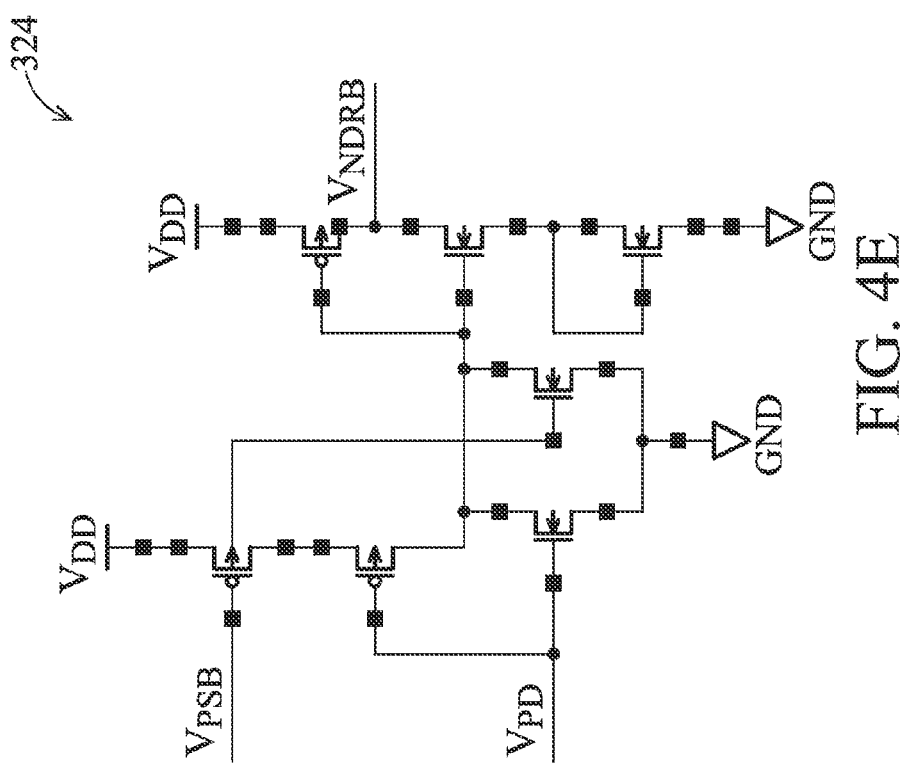
FIG. 4E shows an embodiment of a fourth control logic of the control circuit shown in FIG. 3.
Figure 4D:
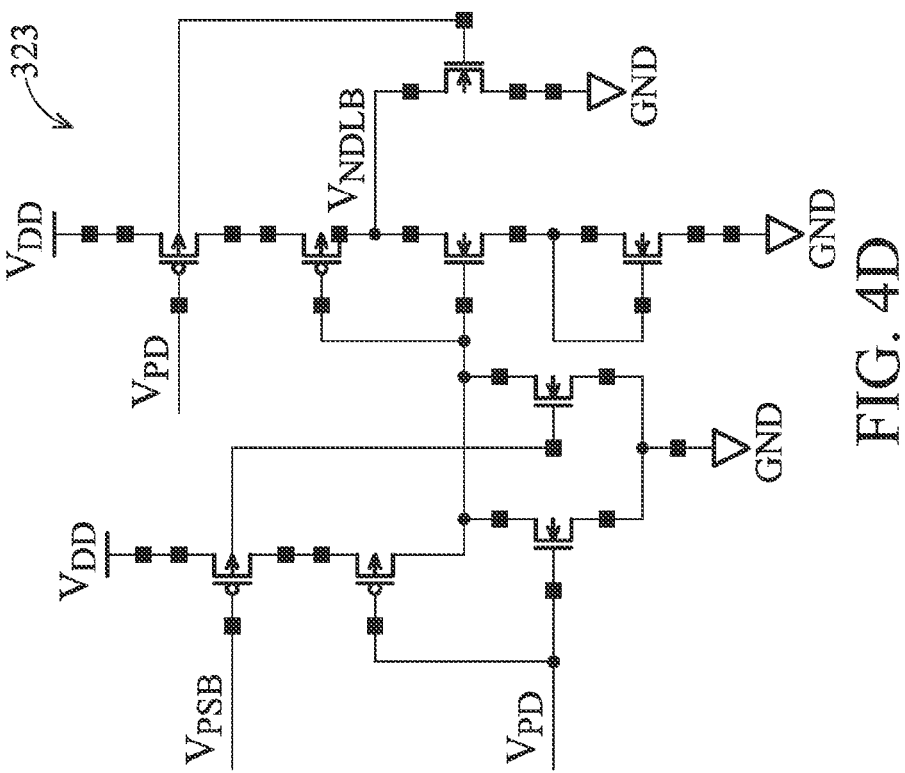
FIG. 4D shows an embodiment of a third control logic of the control circuit shown in FIG. 3.

In one embodiment, the control circuit 320 includes two inverters 325 and 326 and four control logics 321, 322, 323, and 324. In another embodiment, the inverters 325 and 326 can be omitted. When a power down signal $V_{PD}$ is at a logic high level, the memory circuit 300 can be operated in a power down mode. When a sleep signal $V_{PST}$ is at a logic high level, the memory circuit 300 can be operated in a sleep mode. When both the power down signal $V_{PD}$ and the sleep signal $V_{PST}$ are at a logic low level, the memory circuit 300 can be operated in an active mode. The inverter 325 is capable of inverting the power down signal $V_{PD}$ to obtain an inverted power down signal $V_{PDB}$. The inverter 326 is capable of inverting the sleep signal $V_{PST}$ to obtain an inverted sleep signal $V_{PSB}$. The first control logic 321 is capable of generating the gate voltage $V_{PDL}$ of the PMOS transistor 302 according to the inverted power down signal $V_{PDB}$ and the sleep signal $V_{PST}$. FIG. 4B shows an embodiment of the first control logic 321. The second control logic 322 is capable of generating the gate voltage $V_{PDR}$ of the PMOS transistor 306 according to the inverted power down signal $V_{PDB}$ and the sleep signal $V_{PST}$. FIG. 4C shows an embodiment of the second control logic 322. The third control logic 323 is capable of generating the gate voltage $V_{NDLB}$ of the PMOS transistor 304 according to the power down signal $V_{PD}$ and the inverted sleep signal $V_{PSB}$. FIG. 4D shows an embodiment of the third control logic 323. The fourth control logic 324 is capable of generating the gate voltage $V_{NDRB}$ of the PMOS transistor 308 according to the power down signal $V_{PD}$ and the inverted sleep signal $V_{PSB}$. FIG. 4E shows an embodiment of the fourth control logic 324.

Figure 1A:
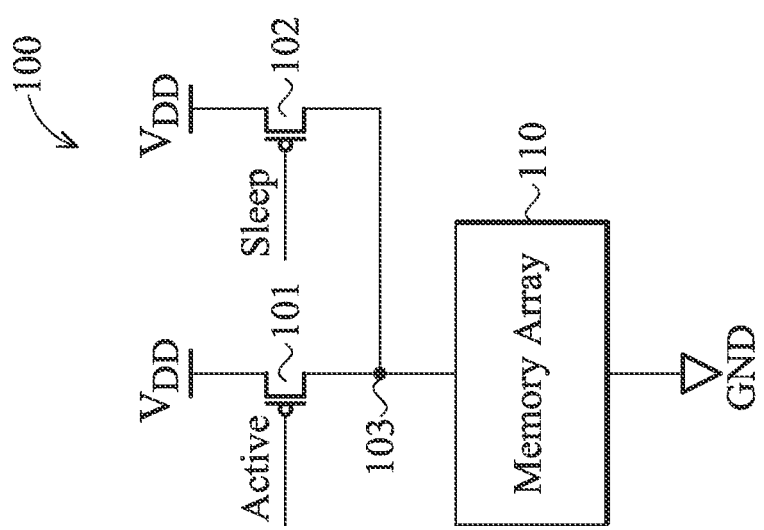
FIG. 1A is a block diagram of a first conventional memory circuit.
Figure 1B:
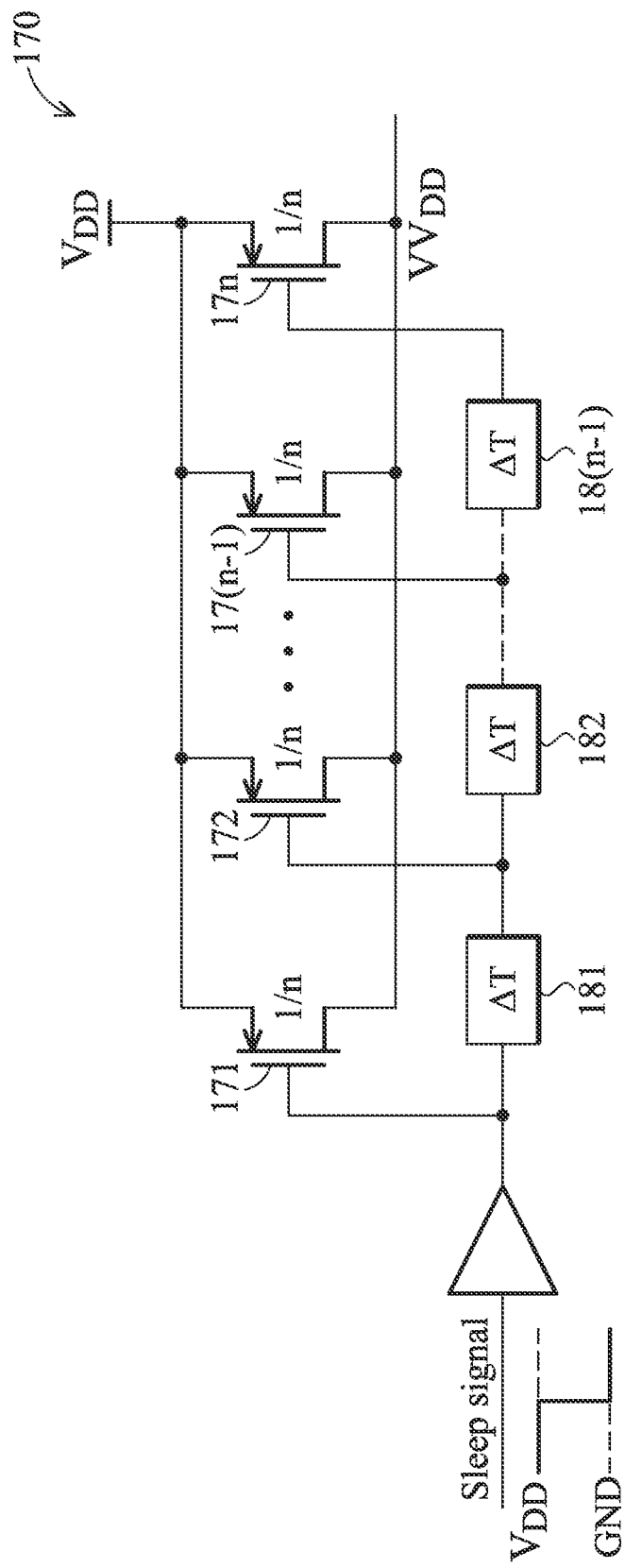
FIG. 1B shows a conventional memory circuit for reducing a rushing power.

When the conventional memory circuit 100 shown in FIG. 1A operates in a power down mode, although the PMOS transistors 101 and 102 are turned off, there may still be a leakage path from the node 103 to the ground GND. The voltage of the node 103 in the power down mode is therefore gradually lowered from the voltage $V_{DD}$ to a value such as 0.1 $V_{DD}$ due to the current leakage. When the operating mode of the memory circuit 100 is switched from the power down mode to the active mode, the memory circuit 100 requires a large charge current to charge the voltage of the node 103 back to the voltage $V_{DD}$, and a long wakeup time is therefore required. In comparison with the conventional memory circuit 100 shown in FIG. 1A, the memory circuit 300 shown in FIG. 3 of the invention has a reduced leakage current in a power down mode. When the operating mode of the memory circuit 300 is switched from the power down mode to an active mode, the memory circuit 300 of the invention therefore does not requires a large charge current and a large rushing power, and a wakeup time of the memory circuit 300 is therefore reduced.

The reason of a reduce leakage current of the memory circuit 300 is at least as follows. The PMOS transistors 302 and 306 and the NMOS transistors 304 and 308 reduce current leakage. For example, when the memory circuit 300 operates in the power down mode, the gate voltage of the PMOS 306 is at a high level such as $V_{DD}$ to turn off the PMOS transistor 306, and the gate voltage of the NMOS 304 is at a low level such as GND to turn off the NMOS transistor 304. The voltage of the node $N_{RH}$ is therefore lower than the gate voltage $V_{DD}$ of the PMOS transistor 306, and the voltage of the node $N_{LG}$ is therefore higher than the gate voltage GND of the NMOS transistor 304. Because the gate voltage of the PMOS transistor 206 of the memory cell such as 311 is at a high voltage such as $V_{DD}$, and the voltage of the node $N_{RH}$ is lower than the voltage $V_{DD}$, the source-to-gate voltage $V_{sG}$ of the PMOS transistor 206 is therefore negative, further reducing a leakage current passing through the PMOS transistor 206 of the memory dell such as 311. Because the gate voltage of the NMOS transistor 204 of the memory cell such as 311 is at a low voltage such as GND, and the voltage of the node $N_{LG}$ is higher than the voltage GND, the gate-to-source voltage $V_{GS}$ of the NMOS transistor 204 is therefore also negative, further reducing a leakage current passing through the NMOS transistor 204 of the memory cell such as 311. Similarly, the leakage currents passing through the PMOS transistor 202 and the NMOS transistor 208 can be reduced. Furthermore, if voltages lower than the voltage GND are applied to gates of the NMOS transistors 304 and 308 in the power down mode, the leakage currents flowing through the NMOS transistors 304 and 308 can be further reduced. Similarly, if voltages higher than the voltage $V_{DD}$ are applied to the gates of the PMOS transistors 302 and 306 in the power down mode, the leakage currents flowing through the PMOS transistors 302 and 306 can be further reduced. The memory circuit 300 shown in FIG. 3 therefore can have a shorter wakeup time period and a lower rushing power than those of the conventional memory circuit 100 when an operating mode of the memory circuit 300 is changed from a power down mode to an active mode. The performance of the memory circuit 300 is therefore better than that of the conventional memory circuit 100.

Figure 5A:
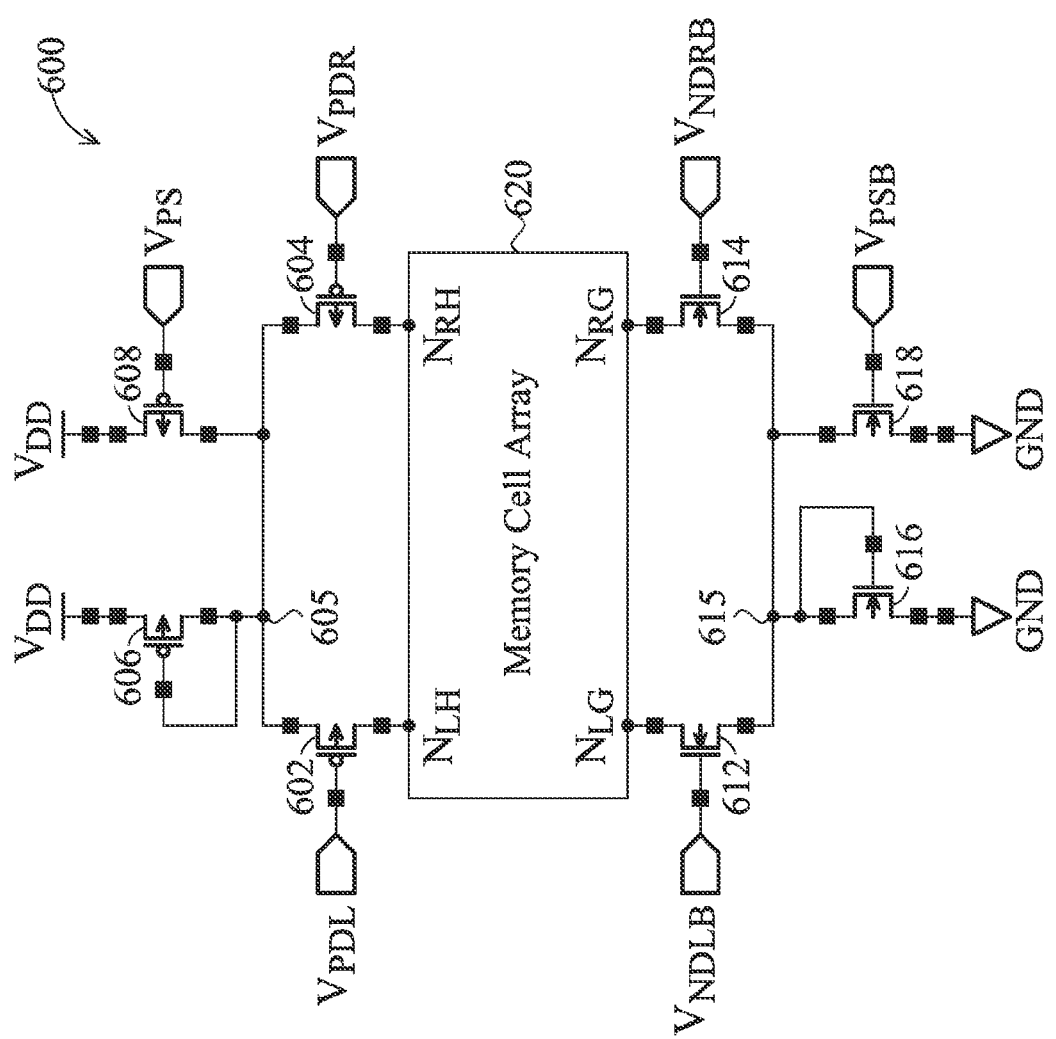
FIG. 5A is a block diagram of at least a portion of a second embodiment of a memory circuit according to the invention.

Referring to FIG. 5A, a block diagram of at least a portion of a second embodiment of a memory circuit 600 according to the invention is shown. The memory circuit 600 can also operate in a power down mode, an active mode, or a sleep mode as the memory circuit 300. The operation of the memory circuit 600 in the three modes can be similar to that of the memory circuit 300 in the corresponding modes. In one embodiment, the memory circuit 600 includes PMOS transistors 602, 604, 606, and 608, NMOS transistors 612, 614, 616, and 618, a memory cell array 620, and a control circuit (not shown in FIG. 5A). The memory cell array 620 includes a plurality of memory cells. In this embodiment, at least one of the memory cells of the memory cell array 620 includes two inverters 220 and 230, as the memory cell 200 shown in FIG. 2. The positive power terminal of the first inverter 220 of at least one of the memory cells of the memory cell array 620 is coupled to a first node $N_{LH}$. The negative power terminal of the first inverter 220 of at least one of the memory cells of the memory cell array 620 is coupled to a third node $N_{LG}$. The positive power terminal of the second inverter 230 of at least one of the memory cells of the memory cell array 620 is coupled to a second node $N_{RH}$. The negative power terminal of the second inverter 230 of at least one of the memory cells of the memory cell array 620 is coupled to a fourth node $N_{RG}$. In one embodiment, each of the memory cells includes two inverters 220 and 230, and the positive power terminals of the first inverters 220 of the memory cells are all coupled to a first node $N_{LH}$, the negative power terminals of the first inverters 220 of the memory cells are all coupled to a third node $N_{LG}$, the positive power terminals of the second inverters 230 of the memory cells are all coupled to a third node $N_{RH}$ and the negative power terminals of the second inverters 230 of the memory cells are all coupled to a fourth node $N_{RG}$.

The PMOS transistors 606 and 608 are coupled between a first voltage terminal such as $V_{DD}$ and a node 605. The gate of the PMOS transistor 606 is also coupled to the node 605. The PMOS transistor 602 is coupled between the node 605 and the first node $N_{LH}$. The PMOS transistor 604 is coupled between the node 605 and the second node $N_{RH}$. The NMOS transistors 616 and 618 are coupled between a node 615 and a second voltage terminal such as GND. The gate of the NMOS transistor 616 is also coupled to the node 615. The NMOS transistor 612 is coupled between the third node $N_{LG}$ and the node 615. The NMOS transistor 614 is coupled between the fourth node $N_{RG}$ and the node 615.

The control circuit is capable of controlling the gate voltages of the PMOS transistors 602, 604, and 608, and the NMOS transistors 612, 614, and 618 according to the operating mode of the memory circuit 600. Referring to FIG. 5B, gate voltages of the PMOS transistors 602, 604, and 608, and the NMOS transistors 612, 614, and 618 of the memory circuit 600 corresponding to different operating modes are shown. When the memory circuit 600 is in a power down mode, the control circuit is capable of setting the gate voltages $V_{PS}$, $V_{PDL}$, and $V_{NDLB}$ of the PMOS transistor 608, the PMOS transistor 602, and the NMOS transistor 612 to a logic low voltage, and setting the gate voltages $V_{PDR}$, $V_{PSB}$, and $V_{NDRB}$ of the PMOS transistor 604, the NMOS transistor 618, and the NMOS transistor 614 to a logic high voltage. When the memory circuit 600 is in an active mode, the control circuit is capable of setting the gate voltages $V_{PS}$, $V_{PDL}$, and $V_{PDR}$ of the PMOS transistors 608, 602, and 604 to a logic low voltage, and setting the gate voltages $V_{PSB}$, $V_{NDLB}$, and $V_{NDRB}$ of the NMOS transistors 618, 612, and 614 to a logic high voltage. When the memory circuit 600 is in a sleep mode, the control circuit is capable of setting the gate voltages $V_{PSL}$, $V_{PDR}$, and $V_{PSB}$ of the PMOS transistor 602, the PMOS transistor 604, and the NMOS transistor 618 to a logic low voltage, and setting the gate voltages $V_{PS}$, $V_{NDLB}$, and $V_{NDRB}$ of the PMOS transistor 608, the NMOS transistor 612, and the NMOS transistor 614 to a logic high voltage.

Figure 6A:
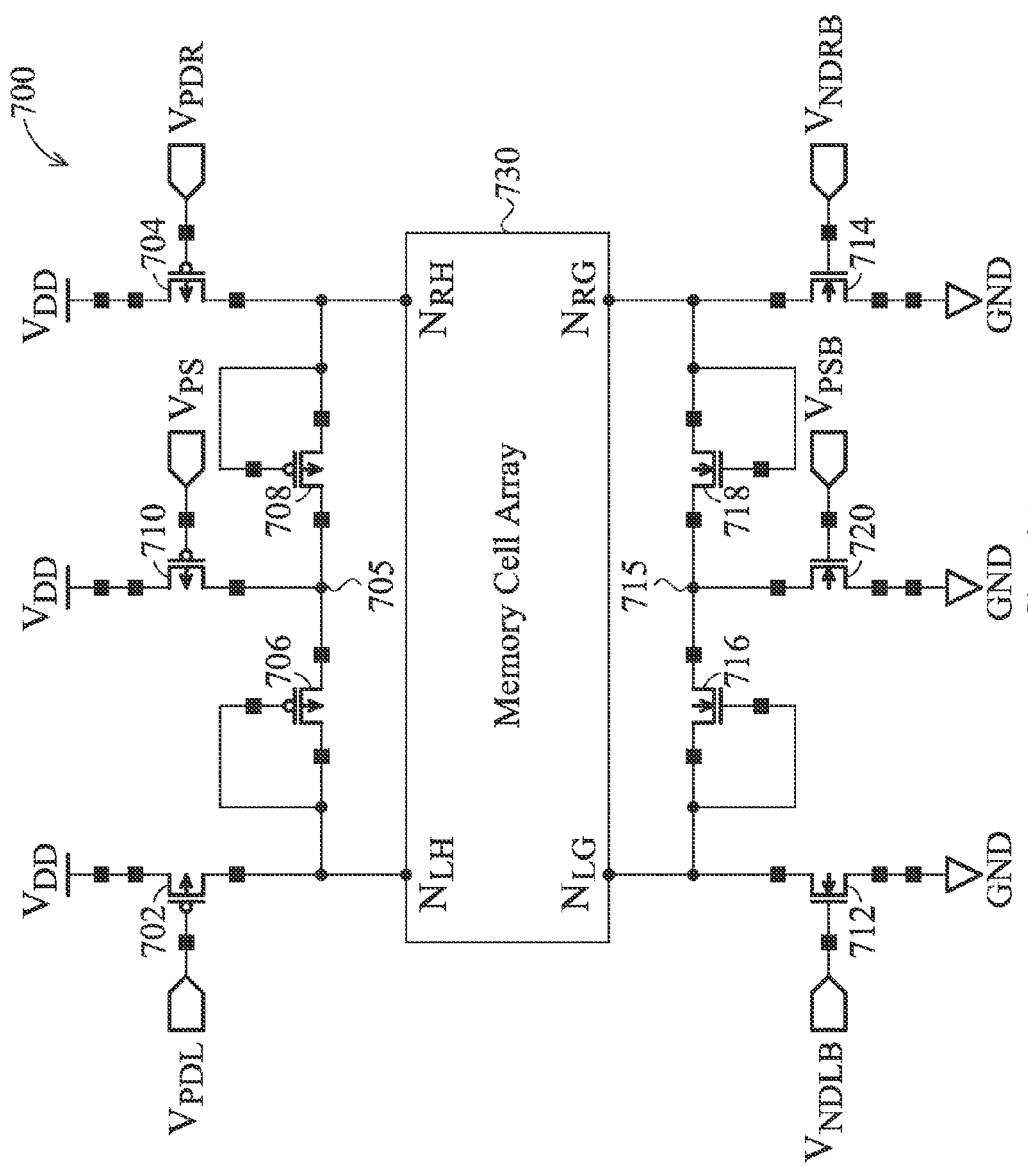
FIG. 6A is a block diagram of at least a portion of a third embodiment of a memory circuit according to the invention.

Referring to FIG. 6A, a block diagram of at least a portion of a third embodiment of a memory circuit 700 according to the invention is shown. The memory circuit 700 can also operate in a power down mode, an active mode, or a sleep mode as the memory circuit 300. The operation of the memory circuit 700 in the three modes is similar to that of the memory circuit 300 in the corresponding modes. In one embodiment, the memory circuit 700 includes PMOS transistors 702, 704, 706, 708, and 710, NMOS transistors 712, 714, 716, 718, and 720, a memory cell array 730, and a control circuit (not shown in FIG. 6A). The memory cell array 730 includes a plurality of memory cells. In this embodiment, at least one of the memory cells of the memory cell array 730 includes two inverters 220 and 230, as the memory cell 200 shown in FIG. 2. The positive power terminal of the first inverter 220 of at least one of the memory cells of the memory cell array 730 is coupled to a first node $N_{LH}$. The negative power terminal of the first inverter 220 of at least one of the memory cells of the memory cell array 730 is coupled to a third node $N_{LG}$. The positive power terminal of the second inverter 230 of at least one of the memory cells of the memory cell array 730 is coupled to a second node $N_{RH}$. The negative power terminal of the second inverter 230 of at least one of the memory cells of the memory cell array 730 is coupled to a fourth node $N_{RG}$. In one embodiment, each of the memory cells includes two inverters 220 and 230, and the positive power terminals of the first inverters 220 of the memory cells are all coupled to a first node $N_{LH}$, the negative power terminals of the first inverters 220 of the memory cells are all coupled to a third node $N_{LG}$, the positive power terminals of the second inverters 230 of the memory cells are all coupled to a third node $N_{RH}$ and the negative power terminals of the second inverters 230 of the memory cells are all coupled to a fourth node $N_{RG}$.

The PMOS transistor 702 is coupled between a first voltage terminal such as $V_{DD}$ and the first node $N_{LH}$. The PMOS transistor 704 is coupled between the first voltage terminal such as $V_{DD}$ and the second node $N_{RH}$. The PMOS transistor 710 is coupled between the first voltage terminal such as $V_{DD}$ and a node 705. The PMOS transistor 706 is coupled between the node 705 and the first node $N_{LH}$. The gate of the PMOS transistor 706 is also coupled to the first node $N_{LH}$. The PMOS transistor 708 is coupled between the node 705 and the second node $N_{RH}$. The gate of the PMOS transistor 708 is also coupled to the second node $N_{RH}$. The NMOS transistor 712 is coupled between the third node $N_{LG}$ and a second voltage terminal such as GND. The NMOS transistor 714 is coupled between the fourth node $N_{RG}$ and the second voltage terminal such as GND. The NMOS transistor 720 is coupled between a node 715 and the second voltage terminal such as GND. The NMOS transistor 716 is coupled between the node 715 and the third node $N_{LG}$. The gate of the NMOS transistor 716 is also coupled to the third node $N_{LG}$. The NMOS transistor 718 is coupled between the node 715 and the fourth node $N_{RG}$. The gate of the NMOS transistor 718 is also coupled to the fourth node $N_{RG}$.

The control circuit is capable of controlling the gate voltages of the PMOS transistors 702, 704, and 710, and the NMOS transistors 712, 714, and 720 according to the operating mode of the memory circuit 700. Referring to FIG. 6B, gate voltages of the PMOS transistors 702, 704, and 710, and the NMOS transistors 712, 714, and 720 of the memory circuit 700 corresponding to different operating modes are shown. When the memory circuit 700 is in a power down mode, the control circuit is capable of setting the gate voltages $V_{PDL}$, $V_{PSB}$, and $V_{NDLB}$ of the PMOS transistor 702, the NMOS transistor 720, and the NMOS transistor 712 to a logic low voltage, and setting the gate voltages $V_{PS}$, $V_{PDR}$, and $V_{NDRB}$ of the PMOS transistor 710, the PMOS transistor 704, and the NMOS transistor 714 to a logic high voltage. When the memory circuit 700 is in an active mode, the control circuit is capable of setting the gate voltages $V_{PDL}$, $V_{PDR}$, and $V_{PSB}$ of the PMOS transistors 702, the PMOS transistor 704, and the NMOS transistor 720 to a logic low voltage, and setting the gate voltages $V_{PS}$, $V_{NDLB}$, and $V_{NDRB}$ of the PMOS transistor 710, the NMOS transistor 712, and the NMOS transistor 714 to a logic high voltage. When the memory circuit 700 is in a sleep mode, the control circuit is capable of setting the gate voltages $V_{PS}$, $V_{NDLB}$, and $V_{NDRB}$ of the PMOS transistor 710, the NMOS transistor 712, and the NMOS transistor 714 to a logic low voltage, and setting the gate voltages $V_{PDL}$, $V_{PDR}$, and $V_{PSB}$ of the PMOS transistor 702, the PMOS transistor 704, and the NMOS transistor 720 to a logic high voltage.

Figure 7A:
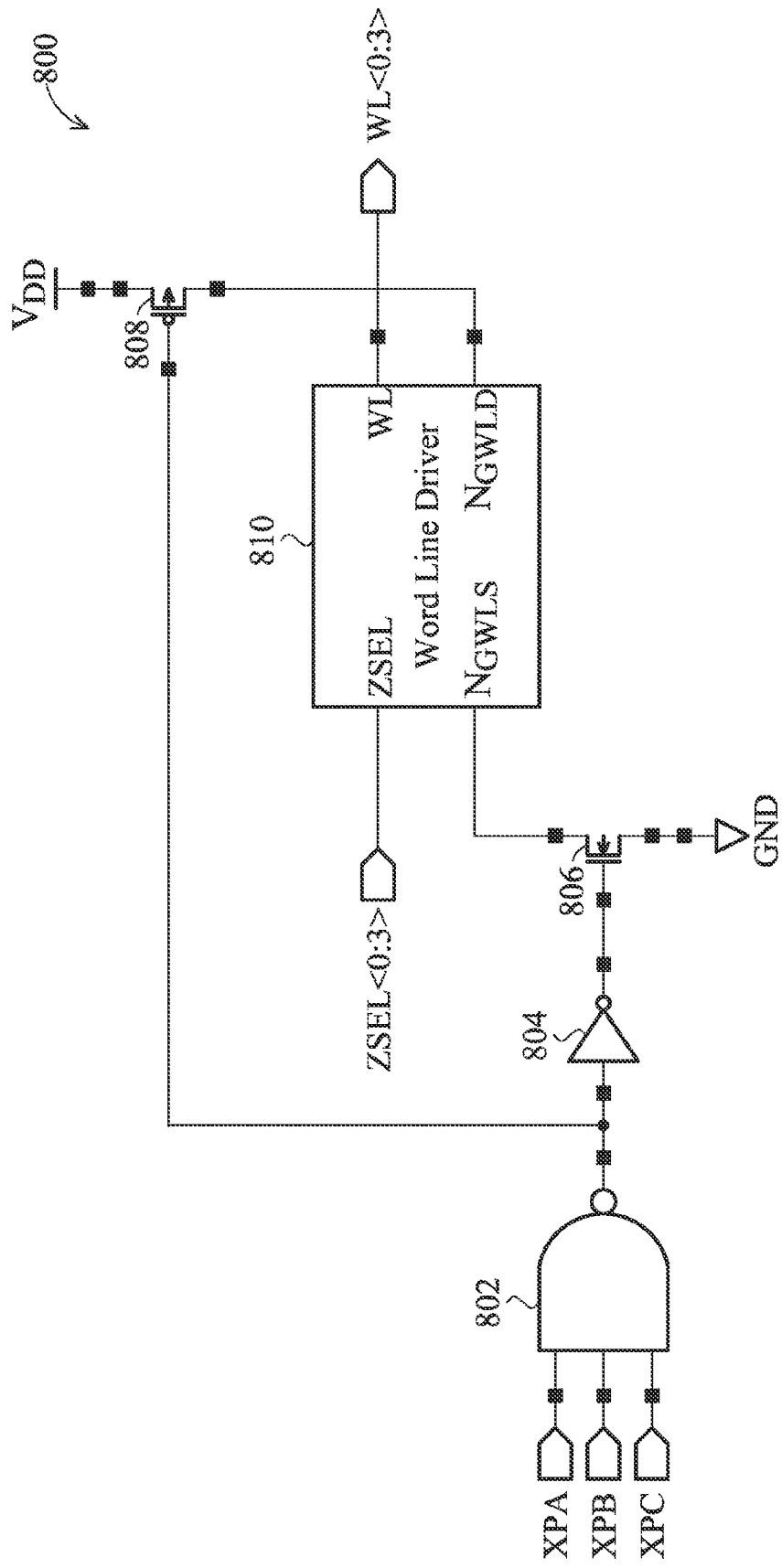
FIG. 7A is a block diagram of a word line control circuit according to the invention.

Referring to FIG. 7A, a block diagram of a word line control circuit 800 according to the invention is shown. In one embodiment, the word line control circuit 800 includes a NAND gate 802, an inverter 804, an NMOS transistor 806, a PMOS transistor 808, and a plurality of word line drivers 810. In another embodiment, the inverter 804 can be omitted. The NAND gate 802 is capable of receiving three input signals XPA, XPB, and XPC. The NAND gate 802 is capable of performing a NAND operation on the three input signals XPA, XPB, and XPC to generate a selection signal. The selection signal can be directly coupled to the PMOS transistor 808, and the PMOS transistor 808 is coupled between a first voltage terminal such as $V_{DD}$ and a first node $N_{GWLD}$. The inverter 804 is capable of inverting the selection signal to obtain an inverted selection signal. The inverted selection signal can be directly coupled to the NMOS transistor 806, and the NMOS transistor 806 is coupled between a second node $N_{GWLS}$ and a second voltage terminal such as GND. In one embodiment, at least one of the plurality of word line drivers 810 has a dedicated selection signal ZSEL and a dedicated word line WL, and includes a first inverter and a second inverter. Negative power terminal of the first inverter of at least one of the word line drivers 810 is coupled to the second node $N_{GWLS}$, and positive power terminal of the second inverter of at least one of the word line drivers 810 is coupled to the first node $N_{GWLD}$. In one embodiment, negative power terminals of the first inverters of the word line drivers 810 are all coupled to the second node $N_{GWLS}$, and positive power terminals of the second inverters of the word line drivers 810 are all coupled to the first node $N_{GWLD}$.

Figure 7B:
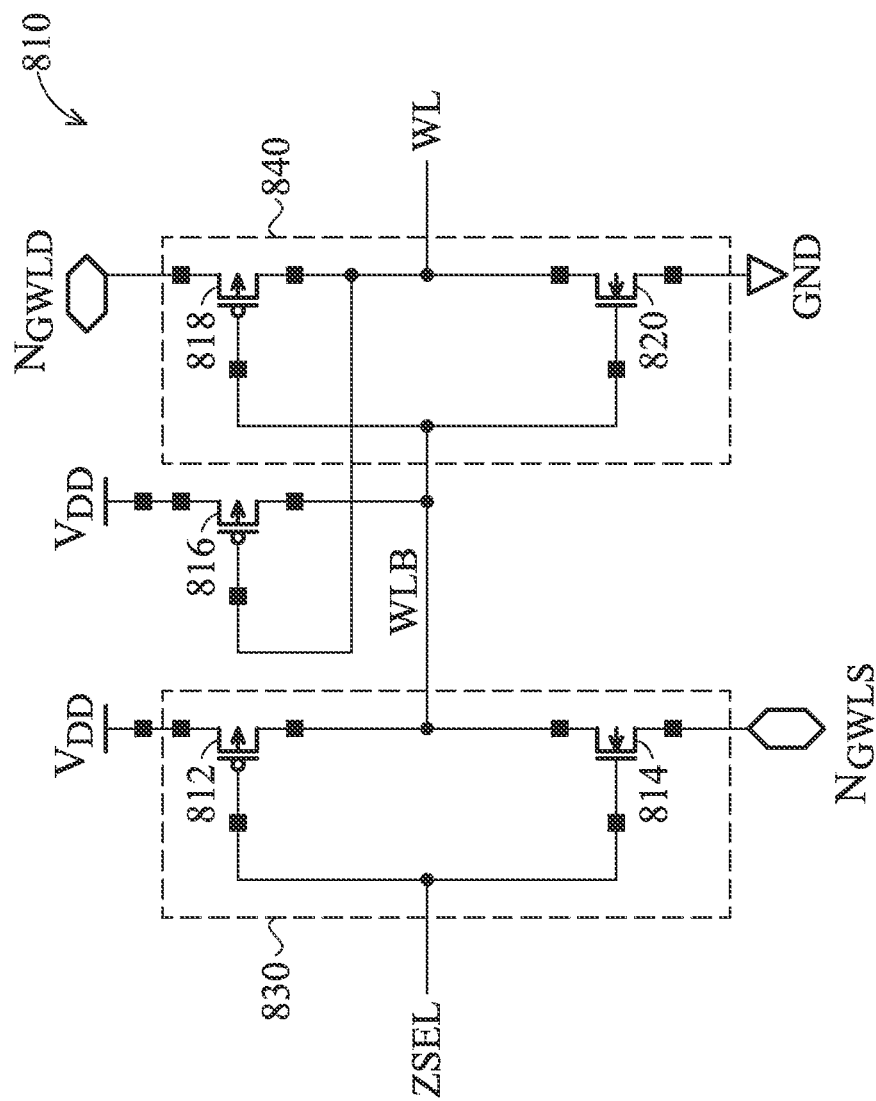
FIG. 7B is a block diagram of a word line driver of the word line control circuit shown in FIG. 7A according to the invention.

Referring to FIG. 7B of the invention, a block diagram of a word line driver 810 according to the invention is shown. In one embodiment, the word line driver 810 includes PMOS transistors 812, 816, and 818, and NMOS transistors 814 and 820, wherein the PMOS transistor 812 and the NMOS transistor 814 form the first inverter 830, and the PMOS transistor 818 and the NMOS transistor 820 form the second inverter 840. The PMOS transistor 812 has a source coupled to a first voltage terminal such as $V_{DD}$, a gate coupled to a dedicated selection signal ZSEL, and a drain coupled to a word bar line WLB. The NMOS transistor 814 has a source coupled to the second node $N_{GWLS}$, a gate coupled to the dedicated selection signal ZSEL, and a drain coupled to the word bar line WLB. The PMOS transistor 816 has a source coupled to the first voltage terminal such as $V_{DD}$, a gate coupled to a word line WL, and a drain coupled to the word bar line WLB. The PMOS transistor 818 has a source coupled to the first node $N_{GWLD}$, a gate coupled to the word bar line WLB, and a drain coupled to the word line WL. The NMOS transistor 820 has a source coupled to the second voltage terminal such as GND, a gate coupled to the word bar line WLB, and a drain coupled to the word line WL.

When the voltages of the three input signals XPA, XPB, and XPC are at a logic high level, the word line control circuit 800 is in an active mode, and the NAND gate 802 is capable of generating a logic low voltage as the selection signal. The logic low voltage of the selection signal then turns on the PMOS transistor 808, pulling up the voltage of the first node $N_{GWLD}$ toward the voltage of the first voltage terminal such as $V_{DD}$. The logic high voltage of the inverted selection signal then turns on the NMOS transistor 806, pulling down the voltage of the second node $N_{GWLS}$ toward the voltage of the second voltage terminal such as GND. The power across the first voltage terminal such as VDD and the second voltage terminal such as GND can then be fed to the word line drivers 810 via the first node $N_{GWLD}$ and the second node $N_{GWLS}$. The first inverter 830 then is capable of inverting the voltage of the dedicated selection signal ZSEL to obtain the voltage of the word bar line WLB, and the second inverter 840 then is capable of inverting the voltage of the word bar line WLB to obtain the voltage of the word line WL.

On the contrary, when the voltage of at least one of the three input signals XPA, XPB, and XPC is at a logic low level, the word line control circuit 800 is in a de-active mode, and the NAND gate 802 is capable of generating a logic high voltage as the selection signal. The logic high voltage of the selection signal then turns off the PMOS transistor 808, floating the first node $N_{GWLD}$. The logic low voltage of the inverted selection signal then turns off the NMOS transistor 806, floating the second node $N_{GWLS}$. The voltage of the word bar line WLB is therefore pulled up to a logic high voltage, and the voltage of the word line WL is therefore pulled down to a logic low voltage.

Assume that a memory circuit includes 512 word line control circuits 800, and at least one word line control circuit 800 includes four word line drivers 810. The memory circuit therefore includes 2048 word lines. When a target word line is selected, only the word line control circuit 800 corresponding to the target word line enters an active mode, and all 511 other word line control circuits 800 of the memory circuit are in a de-active mode. Because the word line control circuit operating in an active mode has a leakage current, and only one selected word line control circuit 800 of 512 word line control circuits 800 of the memory circuit is in the active mode, the leakage current of the word line control circuits 800 of the memory circuit is reduced by a ratio of 1/512, improving the performance of the memory circuit.

Figure 8:
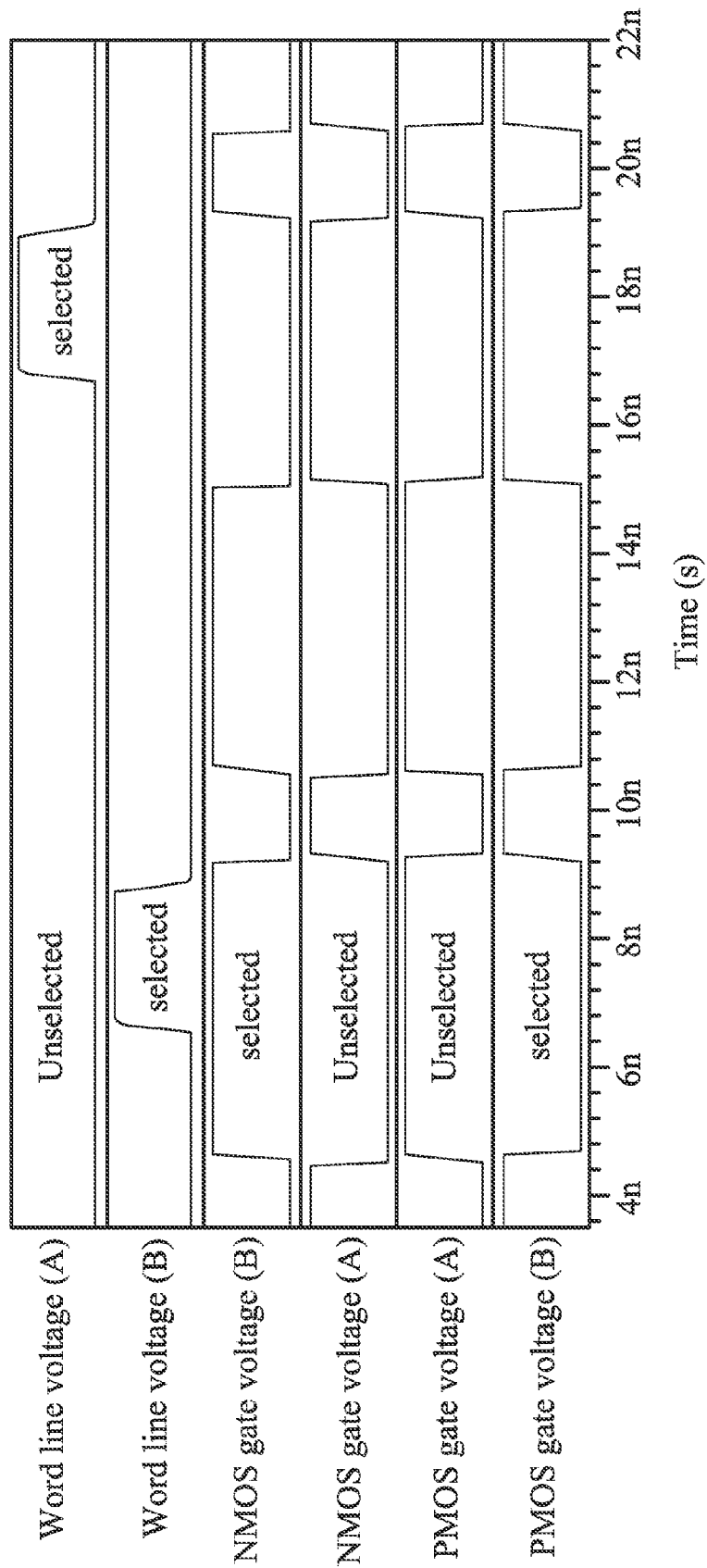
FIG. 8 is a schematic diagram of voltages of selected and unselected word line control circuits according to the invention.

Referring to FIG. 8, a schematic diagram of voltages of selected and unselected word line control circuits according to the invention are shown. Assume that there are two word line control circuits A and B. A word line of the word line control circuiteB is selected. The gate voltage of the NMOS transistor 806 of the selected word line control circuit B is therefore pulled up to a logic high level, and the gate voltage of the PMOS transistor 808 of the selected word line control circuit B is therefore pulled down to a logic low level, making the selected word line control circuit B enter an active mode. No word lines of the word line control circuit A are selected. The gate voltage of the NMOS transistor 806 of the unselected word line control circuit A is therefore pulled down to a logic low level, and the gate voltage of the PMOS transistor 808 of the unselected word line control circuit A is therefore pulled up to a logic high level, making the selected word line control circuit A enter a de-active mode.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory circuit, comprising:
    a first PMOS transistor, coupled between a first voltage terminal and a first node;
    a second PMOS transistor, coupled between the first voltage terminal and a second node;
    a first NMOS transistor, coupled between a third node and a second voltage terminal;
    a second NMOS transistor, coupled between a fourth node and the second voltage terminal;
    a memory cell array, comprising a plurality of memory cells, wherein at least one of the memory cells comprises a first inverter and a second inverter, wherein a positive power terminal of the first inverter is coupled to the first node, a negative power terminal of the first inverter is coupled to the third node, a positive power terminal of the second inverter is coupled to the second node, and a negative power terminal of the second inverter is coupled to the fourth node;
    a control circuit capable of controlling gate voltages of the first PMOS transistor, the second PMOS transistor, the first NMOS transistor, and the second NMOS transistor, and when the memory circuit operates in a power down mode, the control circuit is capable of controlling the gate voltages to turn on the first PMOS transistor, turn off the second PMOS transistor, turn off the first NMOS transistor, and turn on the second NMOS transistor, to pull an output voltage of the first inverter of the memory cell to a logic high voltage and pull an output voltage of the second inverter of the memory cell to a logic low voltage.

2. The memory circuit as claimed in claim 1, wherein the first inverter comprises:
    a third PMOS transistor, having a source coupled to the first node; and
    a third NMOS transistor, having a source coupled to the third node, a gate coupled to a gate of the third PMOS transistor, and a drain coupled to a drain of the third PMOS transistor, and the second inverter comprises:
a fourth PMOS transistor, having a source coupled to the second node, a gate coupled to the drain of the third PMOS transistor, and a drain coupled to the gate of the third PMOS transistor; and
a fourth NMOS transistor, having a source coupled to the fourth node, a gate coupled to the gate of the fourth PMOS transistor, and a drain coupled to the drain of the fourth PMOS transistor.

3. The memory circuit as claimed in claim 1, wherein the memory cell further comprises:
a first transmission gate transistor, coupled between a bit line and an output terminal of the first inverter, having a gate coupled to a word line; and
a second transmission gate transistor, coupled between a bit bar line and an output terminal of the second inverter, having a gate coupled to the word line.

4. The memory circuit as claimed in claim 1, wherein when the memory circuit operates in an active mode, the control circuit is capable of controlling the gate voltages of the first PMOS transistor, the second PMOS transistor, the first NMOS transistor and the second NMOS transistor, to turn on the first PMOS transistor and the second PMOS transistor, and turn on the first NMOS transistor and the second NMOS transistor, to make the memory cells store data.

5. The memory circuit as claimed in claim 1, wherein when the memory circuit operates in a sleep mode, the control circuit is capable of controlling the gate voltages of the first PMOS transistor, the second PMOS transistor, the first NMOS transistor, and the second NMOS transistor to be the threshold voltages of the first PMOS transistor, the second PMOS transistor, the first NMOS transistor, and the second NMOS transistor, to make the memory cells to keep data stored therein with a reduced power consumption.

6. The memory circuit as claimed in claim 5, wherein the control circuit comprises:
a first control logic, capable of controlling the gate voltage of the first PMOS transistor according to an inverted power down signal and a sleep signal;
a second control logic, capable of controlling the gate voltage of the second PMOS transistor according to the inverted power down signal and the sleep signal;
a third control logic, capable of controlling the gate voltage of the first NMOS transistor according to a power down signal and an inverted sleep signal; and
a fourth control logic, capable of controlling the gate voltage of the second NMOS transistor according to the power down signal and the inverted sleep signal;
wherein the inverted power down signal is obtained by inverting the power down signal, the power down signal indicates whether the memory circuit is operating in the power down mode, and the inverted sleep signal is obtained by inverting the sleep signal, wherein the sleep signal indicates whether the memory circuit is operating in the sleep mode.

7. A memory circuit, comprising:
a first PMOS transistor, coupled between a fifth node and a first node;
a second PMOS transistor, coupled between the fifth node and a second node;
a third PMOS transistor, coupled between a first voltage terminal and the fifth node, having a gate coupled to the fifth node;
a fourth PMOS transistor, coupled between the first voltage terminal and the fifth node;
a first NMOS transistor, coupled between a third node and a sixth node;
a second NMOS transistor, coupled between a fourth node and the sixth node;
a third NMOS transistor, coupled between the sixth node and a second voltage terminal, having a gate coupled to the sixth node;
a fourth NMOS transistor, coupled between the sixth node and the second voltage terminal; and
a memory cell array, comprising a plurality of memory cells, wherein at least one of the memory cells comprises a first inverter and a second inverter, wherein a positive power terminal of the first inverter is coupled to the first node, a negative power terminal of the first inverter is coupled to the third node, a positive power terminal of the second inverter is coupled to the second node, and a negative power terminal of the second inverter is coupled to the fourth node.

8. The memory circuit as claimed in claim 7, wherein the first inverter comprises:
a fifth PMOS transistor, having a source coupled to the first node; and
a fifth NMOS transistor, having a source coupled to the third node, a gate coupled to a gate of the fifth PMOS transistor, and a drain coupled to a drain of the fifth PMOS transistor,
and the second inverter comprises:
a sixth PMOS transistor, having a source coupled to the second node, a gate coupled to the drain of the fifth PMOS transistor, and a drain coupled to the gate of the fifth PMOS transistor; and
a sixth NMOS transistor, having a source coupled to the fourth node, a gate coupled to the gate of the sixth PMOS transistor, and a drain coupled to the drain of the sixth PMOS transistor.

9. The memory circuit as claimed in claim 7, wherein the memory circuit further comprises a control circuit capable of controlling gate voltages of the first PMOS transistor, the second PMOS transistor, the fourth PMOS transistor, the first NMOS transistor, the second NMOS transistor, and the fourth NMOS transistor, and when the memory circuit operates in a power down mode, the control circuit is capable of generating a logic low voltage on the gates of the first PMOS transistor, the fourth PMOS transistor, and the first NMOS transistor, and generating a logic high voltage on the gates of the second PMOS transistor, the second NMOS transistor, and the fourth NMOS transistor, to pull an output voltage of the first inverter of the memory cell to the logic high voltage and pull an output voltage of the second inverter of the memory cell to the logic low voltage.

10. The memory circuit as claimed in claim 9, wherein when the memory circuit operates in an active mode, the control circuit is capable of generating a logic low voltage on the gates of the first PMOS transistor, the second PMOS transistor, and the fourth PMOS transistor to turn on the first PMOS transistor, the second PMOS transistor, and the fourth PMOS transistor, and generating a logic high voltage on the gates of the first NMOS transistor, the second NMOS transistor, and the fourth NMOS transistor to turn on the first NMOS transistor, the second NMOS transistor, and the fourth NMOS transistor, to make the memory cells store data.

11. The memory circuit as claimed in claim 9, wherein when the memory circuit operates in a sleep mode, the control circuit is capable of generating a logic low voltage on the gates of the first PMOS transistor, the second PMOS transistor, and the fourth NMOS transistor, and generating a logic high voltage on the gates of the first NMOS transistor, the second NMOS transistor, and the fourth PMOS transistor, to make the memory cells to keep data stored therein with a reduced power consumption.

12. A memory circuit, comprising:
a first PMOS transistor, coupled between a first voltage terminal and a first node;
a second PMOS transistor, coupled between the first voltage terminal and a second node;
a third PMOS transistor, coupled between the first voltage terminal and a fifth node;
a fourth PMOS transistor, coupled between the first node and the fifth node, having a gate coupled to the first node;
a fifth PMOS transistor, coupled between the second node and the fifth node, having a gate coupled to the second node;
a first NMOS transistor, coupled between a third node and a second voltage terminal;
a second NMOS transistor, coupled between a fourth node and the second voltage terminal;
a third NMOS transistor, coupled between a sixth node and the second voltage terminal;
a fourth NMOS transistor, coupled between the sixth node and the third node, having a gate coupled to the third node;
a fifth NMOS transistor, coupled between the sixth node and the fourth node, having a gate coupled to the fourth node; and
a memory cell array, comprising a plurality of memory cells, wherein at least one of the memory cells comprises a first inverter and a second inverter, wherein a positive power terminal of the first inverter is coupled to the first node, a negative power terminal of the first inverter is coupled to the third node, a positive power terminal of the second inverter is coupled to the second node, and a negative power terminal of the second inverter is coupled to the fourth node.

13. The memory circuit as claimed in claim 12, wherein the memory circuit further comprises a control circuit capable of controlling gate voltages of the first PMOS transistor, the second PMOS transistor, the third PMOS transistor, the first NMOS transistor, the second NMOS transistor, and the third NMOS transistor, and when the memory circuit operates in a power down mode, the control circuit is capable of generating a logic low voltage on the gates of the first PMOS transistor, the first NMOS transistor, and the third NMOS transistor, and generating a logic high voltage on the gates of the second PMOS transistor, the third PMOS transistor, and the second NMOS transistor, to pull an output voltage of the first inverter of the memory cell to the logic high voltage and pull an output voltages of the second inverter of the memory cell to the logic low voltage.

14. The memory circuit as claimed in claim 13, wherein when the memory circuit operates in an active mode, the control circuit is capable of generating a logic low voltage on the gates of the first PMOS transistor, the second PMOS transistor, and the third NMOS transistor to turn on the first PMOS transistor and the second PMOS transistor, and generating a logic high voltage on the gates of the first NMOS transistor, the second NMOS transistor, and the third PMOS transistor to turn on the first NMOS transistor and the second NMOS transistor, to make the memory cells store data.

15. The memory circuit as claimed in claim 13, wherein when the memory circuit operates in a sleep mode, the control circuit is capable of generating a logic high voltage on the gates of the first PMOS transistor, the second PMOS transistor, and the third NMOS transistor, and generating a logic low voltage on the gates of the first NMOS transistor, the second NMOS transistor, and the third PMOS transistor, to make the memory cells to keep data stored therein with a reduced power consumption.

\* \* \* \* \*